United States Patent
Trivedi

(10) Patent No.: US 9,869,024 B2
(45) Date of Patent: Jan. 16, 2018

(54) METHODS AND APPARATUS FOR DEPOSITING A COBALT LAYER USING A CAROUSEL BATCH DEPOSITION REACTOR

(71) Applicant: APPLIED MATERIALS, INC., Santa Clara, CA (US)

(72) Inventor: Mayur Trivedi, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/802,275

(22) Filed: Jul. 17, 2015

(65) Prior Publication Data

US 2016/0017482 A1 Jan. 21, 2016

Related U.S. Application Data

(60) Provisional application No. 62/025,875, filed on Jul. 17, 2014.

(51) Int. Cl.
| | | |
|---|---|---|
| C23C 16/06 | (2006.01) |
| C23C 16/46 | (2006.01) |
| C23C 16/04 | (2006.01) |
| C23C 16/16 | (2006.01) |
| C23C 16/18 | (2006.01) |
| C23C 16/56 | (2006.01) |

(52) U.S. Cl.
CPC ............ *C23C 16/46* (2013.01); *C23C 16/045* (2013.01); *C23C 16/16* (2013.01); *C23C 16/18* (2013.01); *C23C 16/56* (2013.01)

(58) Field of Classification Search
None
See application file for complete search history.

(56) References Cited

U.S. PATENT DOCUMENTS

| | | | |
|---|---|---|---|
| 6,797,340 B2 | 9/2004 | Fang et al. | |
| 2004/0052972 A1 | 3/2004 | Schmitt | |
| 2007/0202254 A1* | 8/2007 | Ganguli | .................. C23C 16/18 427/252 |
| 2008/0063809 A1 | 3/2008 | Lee et al. | |
| 2010/0199914 A1 | 8/2010 | Iza | |

(Continued)

OTHER PUBLICATIONS

International Search Report and Written Opinion dated Sep. 25, 2015 for PCT Application No. PCT/US2015/040909.

*Primary Examiner* — Joseph Miller, Jr.
(74) *Attorney, Agent, or Firm* — Moser Taboada; Alan Taboada

(57) ABSTRACT

Methods and apparatus for depositing a cobalt layer in features formed on a substrate are provided herein. In some embodiments, a method of depositing a cobalt layer atop a substrate includes: (a) providing a substrate to a substrate support that is rotatable between two processing positions; (b) exposing the substrate to a cobalt containing precursor at a first processing position to deposit a cobalt layer atop the substrate, wherein the substrate at the first processing position is at a first temperature; (c) rotating the substrate to a second processing position; and (d) annealing the substrate at the second processing position to remove contaminants from the cobalt layer, wherein the substrate at the second processing position is at a second temperature greater than the first temperature.

19 Claims, 5 Drawing Sheets

(56) References Cited

U.S. PATENT DOCUMENTS

| | | | |
|---|---|---|---|
| 2011/0027973 A1* | 2/2011 | Su | C23C 16/481 438/478 |
| 2011/0151664 A1 | 6/2011 | Lee et al. | |
| 2012/0222620 A1 | 9/2012 | Yudovsky | |
| 2013/0192761 A1 | 8/2013 | Yudovsky et al. | |

* cited by examiner

METHODS AND APPARATUS FOR DEPOSITING A COBALT LAYER USING A CAROUSEL BATCH DEPOSITION REACTOR

CROSS-REFERENCE TO RELATED APPLICATIONS

This application claims benefit of U.S. provisional patent application Ser. No. 62/025,875, filed Jul. 17, 2014, which is herein incorporated by reference in its entirety.

FIELD

Embodiments of the present disclosure generally relate to substrate processing methods and apparatus, and more specifically, to methods and apparatus for depositing cobalt on a substrate.

BACKGROUND

The inventor has observed that chemical vapor deposition (CVD) of cobalt can be used as a metal deposition technique for applications such as forming metal interconnects in an integrated circuit. CVD cobalt may be deposited within an opening, such as a via or trench, in thin layers and then annealed at about 250 to about 450 degrees Celsius to drive out impurities such as carbon, hydrogen, and oxygen. The deposition and anneal steps may be repeated several times to fill the opening with cobalt. However, conventional CVD chambers may not have anneal capabilities, requiring the substrates to leave the deposition chamber to be annealed and then returned to the CVD chamber for the additional deposition. Thus, the several deposition and anneal steps performed before the opening is filled with cobalt would take a lengthy period of time, resulting in low throughput and high expense for the process.

Thus, the inventor has provided improved methods and apparatus for depositing a cobalt layer in features formed on a substrate.

SUMMARY

Methods and apparatus for depositing a cobalt layer in features formed on a substrate are provided herein. In some embodiments, a method of depositing a cobalt layer atop a substrate includes: (a) providing a substrate to a substrate support that is rotatable between two processing positions; (b) exposing the substrate to a cobalt containing precursor at a first processing position to deposit a cobalt layer atop the substrate, wherein the substrate at the first processing position is at a first temperature; (c) rotating the substrate to a second processing position; and (d) annealing the substrate at the second processing position to remove contaminants from the cobalt layer, wherein the substrate at the second processing position is at a second temperature greater than the first temperature.

In some embodiments, a substrate processing chamber includes: a chamber body having a processing volume; a rotatable substrate support disposed within the chamber body, wherein the substrate support is configured to rotate one or more substrates arranged in a planar array between a first processing position and a second processing position, wherein the first processing position and the second processing position are independently thermally controlled; a showerhead disposed opposite the rotatable substrate support configured to expose the one or more substrates at the first processing position to a cobalt containing precursor; and a heat source disposed within the substrate support configured to heat the one or more substrates at the second processing position.

In some embodiments, a computer readable medium is provided having instructions stored thereon that, when executed, causes a process chamber to perform a method for depositing a cobalt layer atop a substrate. The method may include any of the methods disclosed herein.

Other embodiments and variations of the present disclosure are discussed below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
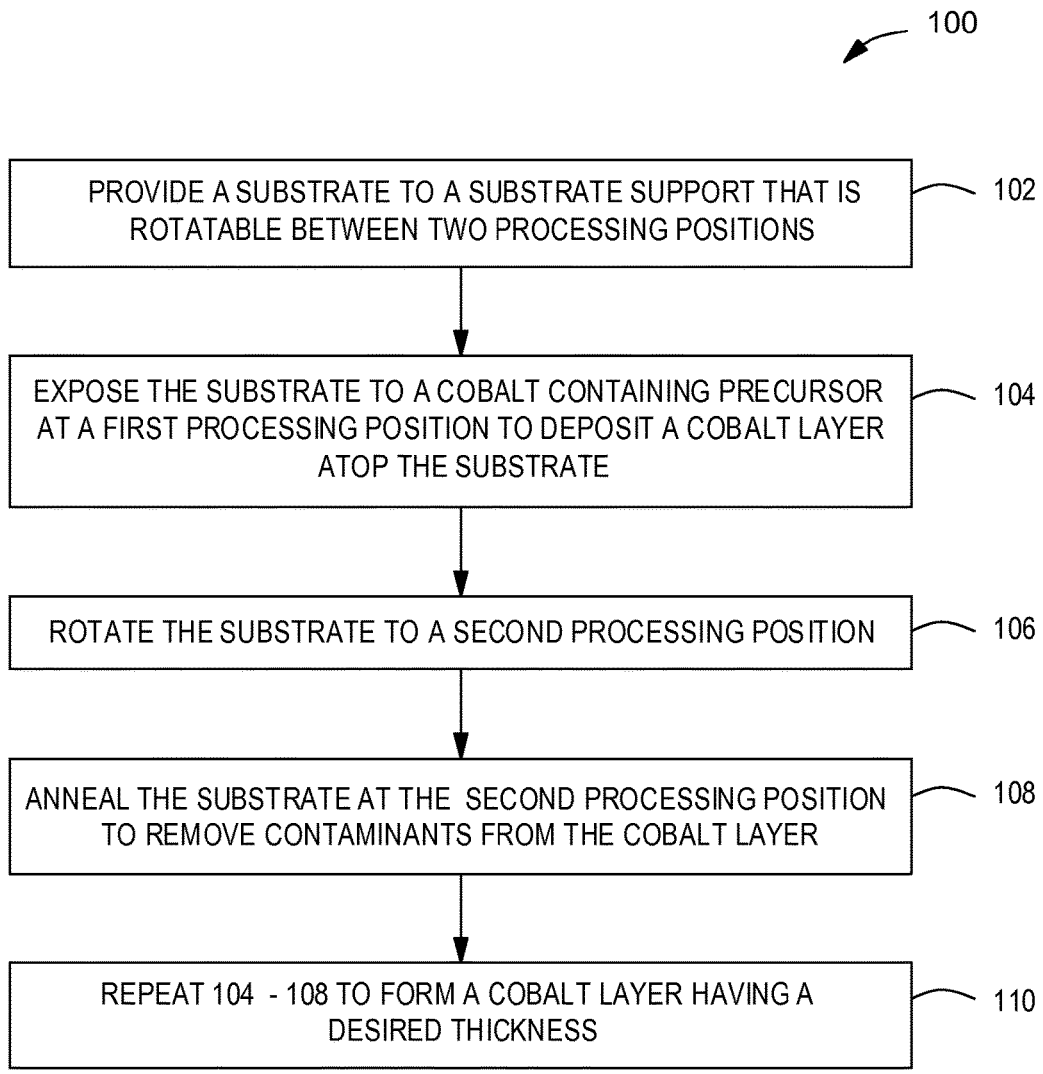
FIG. 1 depicts a method of depositing a cobalt layer atop a substrate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for depositing cobalt in features formed on a substrate are provided herein. In accordance with embodiments of the present disclosure, cobalt is deposited within an opening in thin layers and then annealed to drive out impurities. The inventive methods and apparatus described herein advantageously combine the deposition and anneal process in a single chamber to improve cycle time and throughput. The inventive methods described herein may be utilized in the formation of metal interconnects in an integrated circuit as well as other suitable applications involving depositing a cobalt fill layer with improved cycle time and throughput.

Figure 2A:
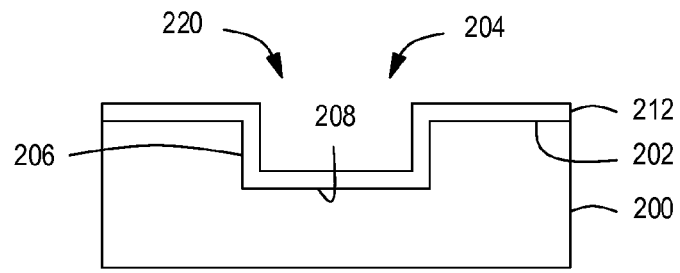
FIGS. 2A-D depicts the stages of filling a feature with cobalt in accordance with some embodiments of the present disclosure.
Figure 2B:
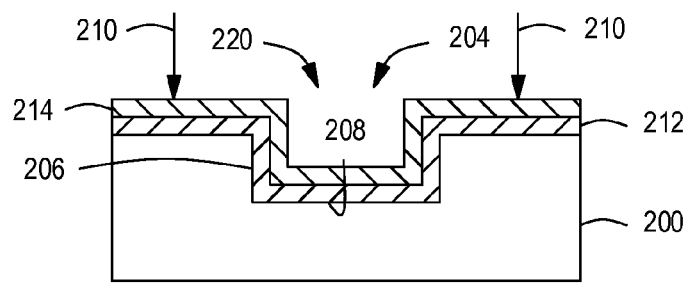

FIG. 1 is a flow diagram of a method 100 for depositing cobalt in accordance with some embodiments of the present disclosure. The method 100 is described below with respect to the stages of filling a feature with cobalt as depicted in FIGS. 2A-2B.

The method begins at 102 by providing one or more substrates to a rotatable substrate support. The substrate support is rotatable between two processing positions. In some embodiments, the substrate support may rotate one or more substrates between a first processing position, where a cobalt layer is deposited onto the one or more substrates, and a second processing position where the cobalt layer is annealed to remove contaminants.

Figure 3:
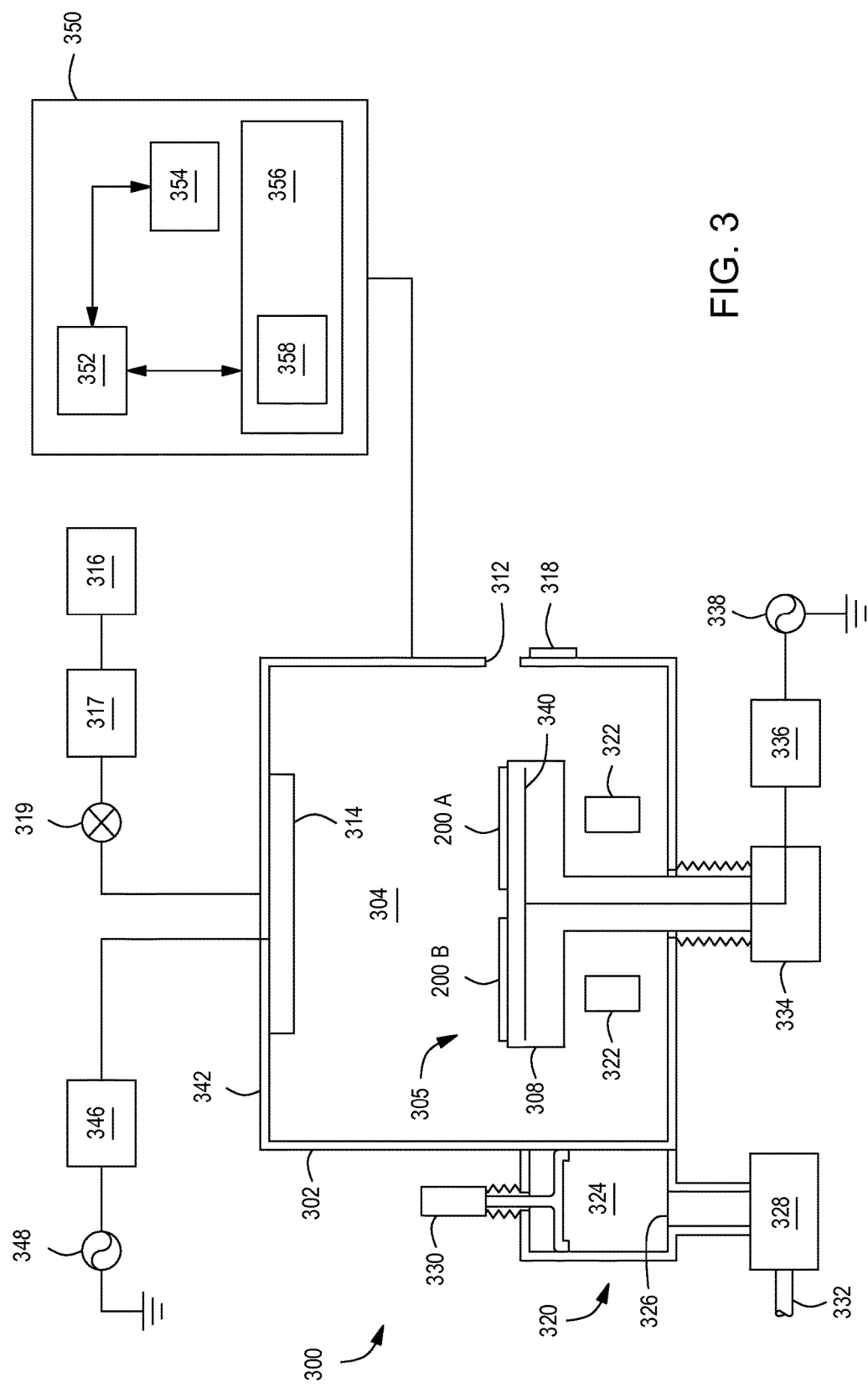
FIG. 3 depicts a process chamber suitable for performing a method of depositing cobalt in features formed on a substrate in accordance with some embodiments of the present disclosure.
Figure 4:
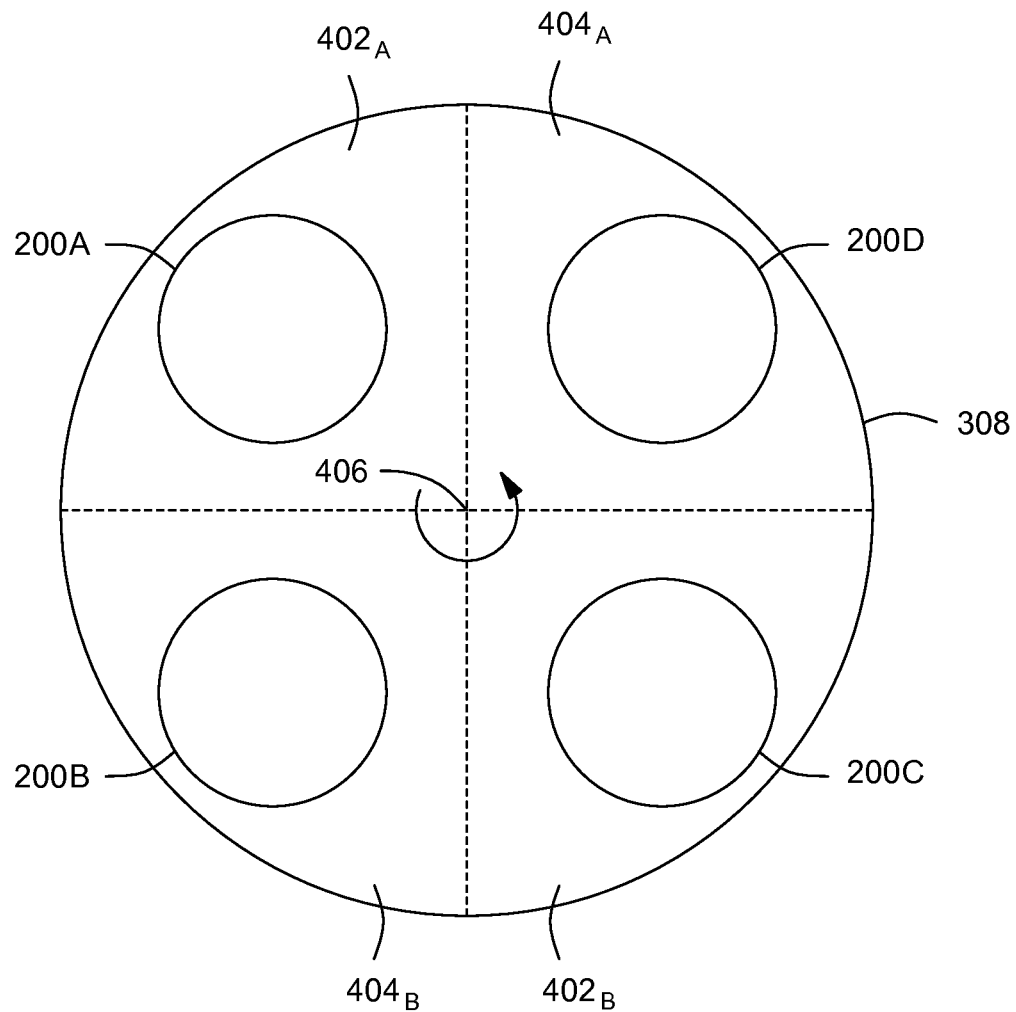
FIG. 4 depicts a top view of a substrate support suitable for performing a method of depositing cobalt in features formed on a substrate in accordance with some embodiments of the present disclosure.
Figure 5:
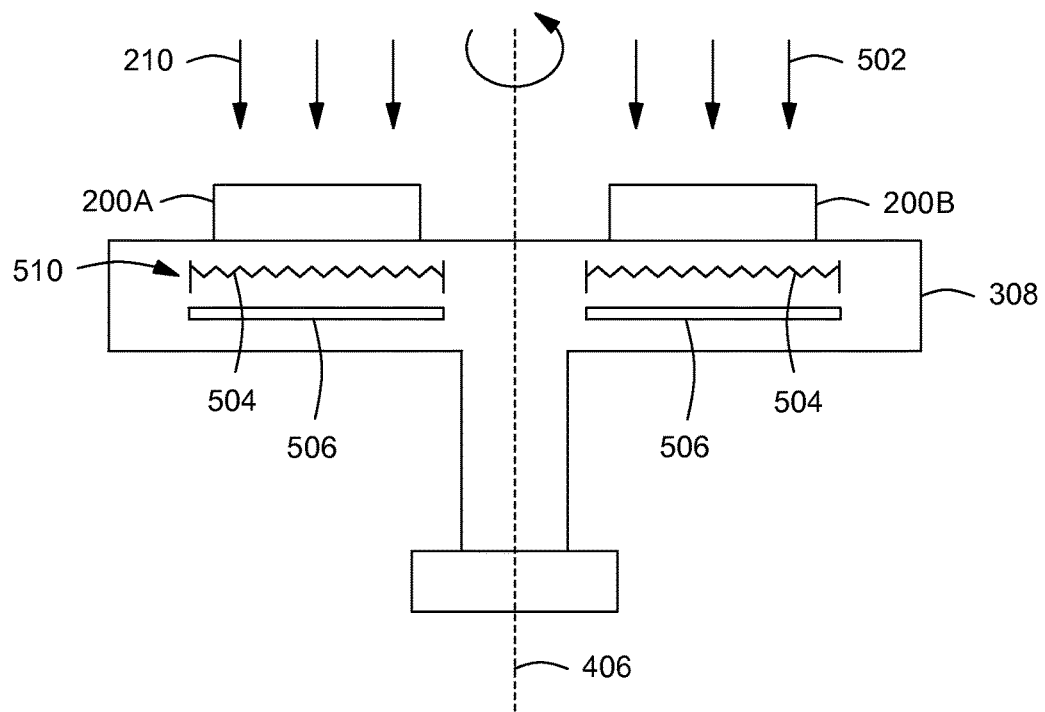
FIG. 5 depicts a side view of a substrate support suitable for performing a method of depositing cobalt in features formed on a substrate in accordance with some embodiments of the present disclosure.

For example, in some embodiment, the substrate support is substrate support 308 depicted in FIG. 3, FIG. 4, and FIG. 5. FIG. 3 depicts a schematic diagram of an illustrative apparatus 300 of the kind that may be used to practice embodiments of the disclosure as discussed herein. The apparatus 300 depicted in FIG. 3 comprises a process chamber 302 having a substrate support 308 disposed in the process chamber for supporting one or more substrates thereupon during processing. In FIG. 3, two substrates 200A and 200B are shown. However, in the present disclosure the substrates are sometimes referred to in aggregate as one or more substrate 200.

FIG. 4 depicts a top view of the substrate support 308 having one or more substrates disposed thereon. In some embodiments, the substrate support 308 may support between 2 and 6 substrates. For example, FIG. 4 depicts a substrate support having four substrates 200A, 200B, 200C, and 200D arranged in a planar array with two substrates 200A, 200C at first processing positions 402A and 402B and two substrates 200B, 200D at second processing positions 404A and 404B. Thus, for example, the substrate support provides support for a plurality of single substrates in a planar array with each single substrate being in a separate processing position. As shown in FIG. 4, multiple processing positions can be configured for the same process (e.g., two first processing positions for example for deposition and two second processing positions for example for annealing). In some embodiments, processes at each processing position may occur simultaneously (e.g. cobalt deposition may occur at two first processing positions while annealing occurs at two second processing positions)

In some embodiments, the substrate support provides support for an even plurality of single substrates in an even plurality of separate processing positions, wherein half of the processing positions are configured for deposition and half of the processing positions are configured for annealing. In some embodiments, the substrate support provides support for an even plurality of single substrates in an even plurality of separate processing positions, wherein all of the processing positions are configured for both deposition and annealing and the appropriate process can be chosen depending upon the need. Accordingly, each of the processing positions can be independently thermally controlled such that the temperature and the deposition positions (e.g., a first temperature) can be controlled simultaneously while providing the temperature used at the deposition positions (e.g., a second temperature greater than the first temperature).

FIG. 5 depicts a side view of the substrate support 308. In some embodiments, the substrate support 308 may rotate in a clockwise or counterclockwise direction about a center 406 of the substrate support 308. In some embodiments, the substrate support 308 may include a mechanism that retains or supports the one or more substrates 200 on the surface of the substrate support 308, such as an electrostatic chuck, a vacuum chuck, a substrate retaining clamp, or the like (not shown).

As depicted in FIG. 2A, the one or more substrates 200 includes a first surface 202 having a feature 204 formed in the first surface 202 of the one or more substrate 200. The feature 204 comprises an opening 220 formed in the first surface 202 of the one or more substrates 200 and extending into the one or more substrates 200 towards an opposing second surface of the one or more substrates 200. For example, the one or more substrates 200 may comprise one or more of silicon (Si), silicon oxide ($SiO_2$), or the like. In addition, the one or more substrates 200 may include additional layers of materials or may have one or more completed or partially completed structures formed therein or thereon.

The opening 220 may be any suitable opening such as a via, trench, dual damascene structure, or the like. In some embodiments, the feature 204 may have a height to width aspect ratio of about 3:1 to about 15:1. The opening 220 may be formed by etching the one or more substrates 200 using any suitable etch process. The opening 220 is defined by one or more sidewalls 206 and a bottom 208.

In some embodiments, a first layer 212 is formed atop the first surface 202, the bottom 208, and the sidewalls 206 prior to depositing cobalt material as described at 106 below. In some embodiments, the first layer 212 may be an oxide material, such as silicon oxide ($SiO_2$) or the like. The oxide material may be deposited or grown by any suitable oxidation process using any suitable process chamber, for example a chemical vapor deposition (CVD) chamber. The oxide material may serve as an electrical and/or physical barrier between the substrate and the cobalt-containing layer to be subsequently deposited in the opening 220, and/or may function as a better surface for attachment during the deposition process discussed below than a native surface of the substrate. In some embodiments, the first layer 212 may include a barrier material deposited atop the oxide layer. In some embodiments, an oxide layer is not present and the barrier material may be the first layer 212 formed atop the first surface 202, the bottom 208 and sidewalls 206 of the feature 204. The barrier material may serve a similar purpose as the oxide material discussed above. In some embodiments, the barrier material may include at least one of titanium (Ti), tantalum (Ta), and oxides or nitrides of Ti, Ta, or the like. The barrier material may be deposited by any suitable methods, such as by CVD or PVD.

Next, at 104, and as depicted in FIG. 2B, the one or more substrates 200 are exposed to a cobalt containing precursor 210 to deposit a cobalt layer 214 atop the one or more substrates 200 and within the feature 204. Each substrate in a first processing position, for example substrates 200A, 200C as shown in FIG. 4, are exposed to the cobalt containing precursor 210. Each substrate at the first processing position is at a first temperature suitable for deposition of a cobalt layer, for example a temperature of about 100 degrees Celsius to about 400 degrees Celsius. In some embodiments, as depicted in FIG. 5, substrate 200A at the first processing position is exposed to the cobalt containing precursor 210 while a flow of inert gas 502, such as nitrogen ($N_2$), is provided to the second processing positions to prevent cobalt containing precursor gas from straying into the second processing positions and depositing a cobalt layer atop substrates 200B, 200D in the second processing positions.

Figure 6:
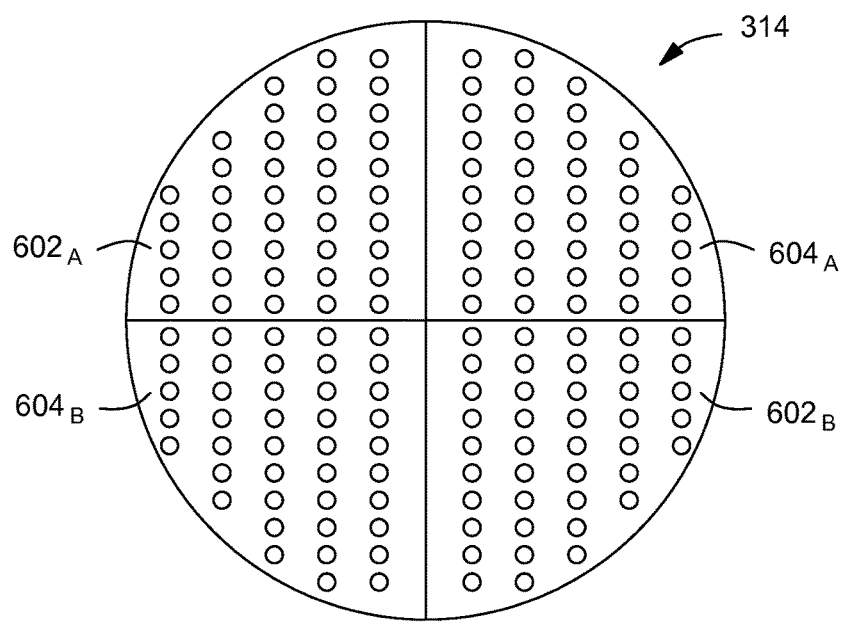
FIG. 6 depicts a bottom view of a showerhead suitable for performing a method of depositing cobalt in features formed on a substrate in accordance with some embodiments of the present disclosure.

The cobalt containing precursor 210 and the inert gas may be provided to the process chamber 302 using any suitable showerhead 314. The showerhead 314 may have a variety of configurations, such as providing gases to one zone or multiple zones of the process chamber. In some embodiments, the showerhead 314, as depicted in FIG. 6 may have multiple zones corresponding to the first and second processing positions 402A-B and 404A-B of the substrate support 308. For example, as depicted in FIG. 6, the showerhead 314 may have first zones 602A and 602B, which for example can supply cobalt containing precursor 210 to the first processing positions 402A and 402B, and second zones 604A and 604B, which for example can supply an inert gas to the second processing positions 404A and 404B to prevent the cobalt containing precursor gas from straying into the second processing positions.

In some embodiments, the one or more substrates 200 are exposed to the cobalt containing precursor 210 at a flow rate of about 750 sccm to about 1000 sccm. In some embodiments, suitable cobalt precursors may include cobalt carbonyl complexes, cobalt amidinate compounds, cobaltocene compounds, cobalt dienyl complexes, cobalt nitrosyl complexes, derivatives thereof, complexes thereof, plasmas thereof, or combinations thereof. In some embodiments, dicobalt hexacarbonyl acetyl compounds may be used to form the cobalt layer. Dicobalt hexacarbonyl acetyl compounds may have the chemical formula of $(CO)_6Co_2(RC\equiv CR')$, wherein R and R' are independently selected from hydrogen, methyl, ethyl, propyl, isopropyl, butyl, tertbutyl, penta, benzyl, aryl, isomers thereof, derivatives thereof, or combinations thereof. In one example, dicobalt hexacarbonyl butylacetylene (CCTBA, $(CO)_6Co_2(HC\equiv CtBu)$) is the cobalt precursor. Other examples of dicobalt hexacarbonyl acetyl compounds include dicobalt hexacarbonyl methylbutylacetylene $((CO)_6Co_2(MeC\equiv CtBu))$, dicobalt hexacarbonyl phenylacetylene $((CO)_6Co_2(HC\equiv CPh))$, hexacarbonyl methylphenylacetylene $((CO)_6Co_2(MeC\equiv CPh))$, dicobalt hexacarbonyl methylacetylene $((CO)_6Co_2(HC\equiv CMe))$, dicobalt hexacarbonyl dimethylacetylene $((CO)_6Co_2(MeC\equiv CMe))$, derivatives thereof, complexes thereof, or combinations thereof. Other exemplary cobalt carbonyl complexes include cyclopentadienyl cobalt bis(carbonyl) $(CpCo(CO)_2)$, tricarbonyl allyl cobalt $((CO)_3Co(CH_2CH\equiv CH_2))$, or derivatives thereof, complexes thereof, or combinations thereof. In some embodiments, the method may further comprise flowing a reactant gas, such as hydrogen ($H_2$), along with the precursor gases. General processing conditions for forming the cobalt layer discussed above include maintaining process chamber pressure at about 15 to about 25 Torr.

In some embodiments, the cobalt layer 214 may be formed via a plasma assisted deposition process, such as a plasma enhanced chemical vapor deposition process or a thermal chemical vapor deposition process. In some embodiments, for example, the one or more substrates 200 may be exposed to the cobalt containing precursor 210 in a plasma state. The plasma may be formed by coupling sufficient energy, for example radio frequency (RF) energy from a power source to ignite the cobalt precursor to form the plasma. In some embodiments, the power source may illustratively provide about 400 watts, of power at a suitable frequency, such as about 13.56 MHz. The plasma facilitates a decomposition of the precursor causing a deposition of material on the one or more substrates 200 to form the cobalt layer 214.

Next, at 106, the substrate having a cobalt layer deposited thereon is rotated to a second processing position. As depicted in FIG. 4, substrates 200A, 200C having a cobalt layer deposited thereon are rotated to the second processing position 404, while substrates 200B, 200D rotate to the first processing position 402 to have a cobalt layer deposited thereon as described above at 104.

Figure 2C:
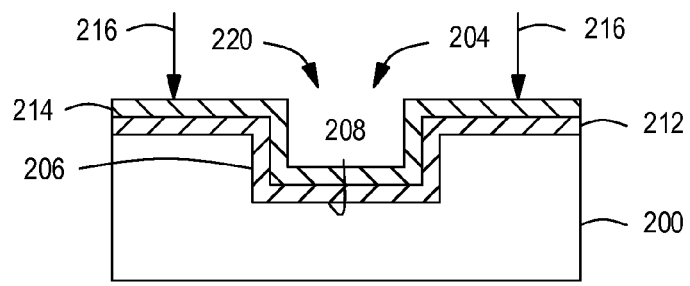

Next, at 108, and as depicted in FIG. 2C, the one or more substrates 200 are annealed 216 to remove contaminants from the cobalt layer. Each substrate at the second processing position, for example substrates 200B, 200D as shown in FIG. 4, is annealed. The one or more substrates 200 are annealed at a temperature of about 150 to about 500 degrees Celsius. In some embodiments, each substrate is annealed for about 50 to about 150 seconds. In some embodiments, after annealing, the one or more substrates 200 may be cooled to a temperature suitable for cobalt deposition. The one or more substrates 200 may be cooled at the second processing position, may be rotated to the first processing position and cooled prior to cobalt deposition, or a combination thereof.

The substrate support 308 may include mechanisms for controlling the substrate temperature such as heating and/or cooling devices for heating the substrate and/or cooling the substrate. For example, in some embodiments, such as depicted in FIG. 5, the one or more substrates 200 are heated and/or cooled using a thermal control device 510 embedded in a substrate support. The thermal control device 510 may include a plurality of zones corresponding to location on the substrate support where an individual substrate is to be disposed. Alternatively, a plurality of thermal control devices may be provided with one thermal control device 510 in each location.

In some embodiments, the thermal control device 510 is a heater 504. The heater 504 may be any type of heater used to heat a process chamber component. For example, in some embodiments, the heater may comprise one or more electrically resistive elements coupled to one or more power sources (e.g., resistive heaters). In embodiments where the substrate support comprises multiple zones or multiple heaters in each processing position, power to all of the multiple zones or multiple heaters may be applied at a different rate for each one of the multiple zones or multiple heaters. In addition to providing independent zones or regions of thermal control corresponding to the position of each substrate on the substrate support, in some embodiments, multiple electrically restive elements may be utilized to provide separate heating zones within the substrate support within a region corresponding to a single substrate. For example, in some embodiments, the substrate support may comprise two heaters creating two heating zones, a center or inner heating zone and an edge or outer heating zone wherein the temperature of each zone is independently controllable. Alternatively, In some embodiments, the one or more substrates 200 may be heated by a lamp head, which is disposed in a position relative to the substrate support 308 suitable to heat the one or more substrates 200. The lamp head generates radiation which is directed to the top surface of the one or more substrates 200. Alternatively or in combination, the lamp head may be configured to heat the bottom surface of the one or more substrates 200, for example, such as by being disposed below the substrate support, or by directing the radiation to the bottom surface of the one or more substrates 200. The lamps may be divided into multiple zones. The zones can be individually adjusted by a controller to allow controlled radiative heating of different areas of the substrate support. In some embodiments, the thermal control device 510 may include a heat exchanger 506 for example having channels to flow a coolant therethrough to remove heat from heated substrates, for example following an anneal process.

In some embodiments, the thermal control device 510 includes both heating and cooling capabilities provided by combinations of the above described embodiments. For example, heating may be provided by the heater 504 (e.g., resistive heating elements or heating lamps) and cooling may be provided by the heat exchanger 506 (e.g., cooling channels to flow a coolant). Thus, the temperature of individual substrates disposed on the substrate support can be advantageously simultaneously processed at different temperatures on the same substrate support. Moreover, a plurality of substrates can be simultaneously supported and their temperatures rapidly increased and decreased repeatedly as the substrate support rotates between processing positions to provide the temperatures used for deposition and anneal processes without removing the substrates from the substrate support until the processes are completed and a film (e.g., a cobalt film) is deposited to a predetermined final thickness.

Figure 2D:
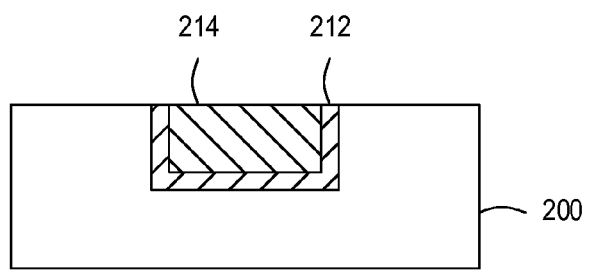

For example, 104-108, as depicted in FIG. 2D, may be repeated until the opening is filled with a cobalt material or until the deposited cobalt layer has a reached a final thickness, for example any thickness suitable for a semiconductor manufacturing process. Further, when the opening 204 has been filled by the cobalt material, the opening 220 may be filled above the level of the upper surface of the substrate and/or deposited material, for example from the cobalt material, may remain on the upper surface of the one or more substrates 200. Accordingly, techniques, such as wet clean in an acidic solution, chemical or electrochemical mechanical polishing, or the like may be subsequently used to remove excess deposited material from the upper surface, such that the opening 220 is filled with the deposited cobalt material up to about an equivalent level with the upper surface.

Returning to FIG. 3, the apparatus 300 may comprise a controller 350 and a process chamber 302 having an exhaust system 320 for removing excess process gases, processing by-products, or the like, from the inner volume 305 of the process chamber 302. Exemplary process chambers may include any of several process chambers configured for chemical vapor deposition (CVD), available from Applied Materials, Inc. of Santa Clara, Calif. Other suitable process chambers from other manufacturers may similarly be used. Such process chambers may be standalone process chambers or part of a cluster tool, such as the CENTURA®, ENDURA®, or PRODUCER® line of process tools also available from Applied Materials, Inc. of Santa Clara, Calif.

The process chamber 302 has an inner volume 305 that includes a processing volume 304. The processing volume 304 may be defined, for example, between a substrate support 308 disposed within the process chamber 302 for supporting one or more substrates 200 upon the substrate support 308 during processing and one or more gas inlets, such as a showerhead 314 and/or nozzles provided at various locations. In some embodiments, the substrate support 308 may include a mechanism that retains or supports the one or more substrates 200 on the surface of the substrate support 308, such as an electrostatic chuck, a vacuum chuck, a substrate retaining clamp, or the like (not shown). In some embodiments, the substrate support 308 may include mechanisms for controlling the substrate temperature and/or for controlling the species flux and/or ion energy proximate the substrate surface.

For example, in some embodiments, the substrate support 308 may include an RF bias electrode 340. The RF bias electrode 340 may be coupled to one or more bias power sources (one bias power source 338 shown) through one or more respective matching networks (matching network 336 shown). The one or more bias power sources may be capable of producing up to 1200 W or RF energy at a frequency of about 2 MHz to about 60 MHz, such as at about 2 MHz, or about 13.56 MHz, or about 60 Mhz. In some embodiments, two bias power sources may be provided for coupling RF power through respective matching networks to the RF bias electrode 340 at respective frequencies of about 2 MHz and about 13.56 MHz. The at least one bias power source may provide either continuous or pulsed power. In some embodiments, the bias power source alternatively may be a DC or pulsed DC source.

The one or more substrates 200 may enter the process chamber 302 via an opening 312 in a wall of the process chamber 302. The opening 312 may be selectively sealed via a slit valve 318, or other mechanism for selectively providing access to the interior of the chamber through the opening 312. The substrate support 308 may be coupled to a lift mechanism 334 that may control the position of the substrate support 308 between a lower position (as shown) suitable for transferring substrates into and out of the chamber via the opening 312 and a selectable upper position suitable for processing. The process position may be selected to maximize process uniformity for a particular process. When in at least one of the elevated processing positions, the substrate support 308 may be disposed above the opening 312 to provide a symmetrical processing region.

The one or more gas inlets (e.g., the showerhead 314) may be coupled to a gas supply 316 for providing one or more process gases through a mass flow controller 317 into the processing volume 304 of the process chamber 302. In addition, one or more valves 319 may be provided to control the flow of the one or more process gases. The mass flow controller 317 and one or more valves 319 may be used individually, or in conjunction to provide the process gases at given flow rates at a constant flow rate, or pulsed (as described above).

Although a showerhead 314 is shown in FIG. 3, additional or alternative gas inlets may be provided such as nozzles or inlets disposed in the ceiling or on the sidewalls of the process chamber 302 or at other locations suitable for providing gases to the process chamber 302, such as the base of the process chamber, the periphery of the substrate support, or the like.

The apparatus 300 may utilize capacitively coupled RF energy for plasma processing. For example, the process chamber 302 may have a ceiling 342 made from dielectric materials and a showerhead 314 that is at least partially conductive to provide an RF electrode (or a separate RF electrode may be provided). The showerhead 314 (or other RF electrode) may be coupled to one or more RF power sources (one RF power source 348 shown) through one or more respective matching networks (matching network 346 shown). The one or more plasma sources may be capable of producing up to about 3,000 W, or in some embodiments, up to about 5,000 W, of RF energy at a frequency of about 2 MHz and/or about 13.56 MHz or a high frequency, such as 27 MHz and/or 60 MHz. The exhaust system 320 generally includes a pumping plenum 324 and one or more conduits that couple the pumping plenum 324 to the inner volume 305 (and generally, the processing volume 304) of the process chamber 302.

A vacuum pump 328 may be coupled to the pumping plenum 324 via a pumping port 326 for pumping out the exhaust gases from the process chamber via one or more exhaust ports (two exhaust ports 322 shown). 302. The vacuum pump 328 may be fluidly coupled to an exhaust outlet 332 for routing the exhaust to appropriate exhaust handling equipment. A valve 330 (such as a gate valve, or the like) may be disposed in the pumping plenum 324 to facilitate control of the flow rate of the exhaust gases in combination with the operation of the vacuum pump 328. Although a z-motion gate valve is shown, any suitable, process compatible valve for controlling the flow of the exhaust may be utilized.

To facilitate control of the process chamber 302 as described above, the controller 350 may be one of any form of general-purpose computer processor that can be used in an industrial setting for controlling various chambers and sub-processors. The memory, or computer-readable medium, 356 of the CPU 352 may be one or more of readily available memory such as random access memory (RAM), read only memory (ROM), floppy disk, hard disk, or any other form of digital storage, local or remote. The support circuits 354 are coupled to the CPU 352 for supporting the processor in a conventional manner. These circuits include cache, power supplies, clock circuits, input/output circuitry and subsystems, and the like.

The inventive methods disclosed herein may generally be stored in the memory 356 as a software routine 358 that, when executed by the CPU 352, causes the process chamber 302 to perform processes of the present disclosure. The software routine 358 may also be stored and/or executed by a second CPU (not shown) that is remotely located from the hardware being controlled by the CPU 352. Some or all of the method of the present disclosure may also be performed in hardware. As such, embodiments of the present disclosure may be implemented in software and executed using a computer system, in hardware as, e.g., an application specific integrated circuit or other type of hardware implementation, or as a combination of software and hardware. The software routine 358 may be executed after the one or more substrates 200 is positioned on the substrate support 308. The software routine 358, when executed by the CPU 352, transforms the general purpose computer into a specific purpose computer (controller) 350 that controls the chamber operation such that the methods disclosed herein are performed.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure.

While the foregoing is directed to embodiments of the present disclosure, other and further embodiments of the disclosure may be devised without departing from the basic scope thereof.

The invention claimed is:

1. A method of depositing a cobalt layer atop a substrate disposed in a process chamber, comprising:
   (a) providing a substrate to a substrate support that is rotatable between two processing positions within the process chamber;
   (b) exposing the substrate to a cobalt containing precursor at a first processing position within the process chamber to deposit a cobalt layer atop the substrate, wherein the substrate at the first processing position is at a first temperature;
   (c) rotating the substrate to a second processing position within the process chamber; and
   (d) annealing the substrate at the second processing position to remove contaminants from the cobalt layer, wherein the substrate at the second processing position is at a second temperature greater than the first temperature, and wherein (b) and (d) occur simultaneously.

2. The method of claim 1, further comprising repeating (b)-(d) to form a cobalt layer having a final thickness.

3. The method of claim 1, wherein the cobalt containing precursor comprises one or more of cobalt carbonyl complexes, cobalt amidinate compounds, cobaltocene compounds, cobalt dienyl complexes, cobalt nitrosyl complexes, dicobalt hexacarbonyl acetyl compounds, cyclopentadienyl cobalt bis(carbonyl) ($CpCo(CO)_2$), tricarbonyl allyl cobalt ($(CO)_3Co(CH_2CH=CH_2)$).

4. The method of claim 1, further comprising maintaining a process chamber pressure at about 15 to about 25 Torr.

5. The method of claim 1, wherein exposing the substrate to a cobalt containing precursor further comprises exposing the substrate to a cobalt containing precursor in a plasma state.

6. The method of claim 1, wherein the first temperature is about 100 to about 400 degrees Celsius and the second temperature is about 150 degrees Celsius to about 500 degrees Celsius.

7. The method of claim 1, further comprising annealing the substrate for about 50 seconds to about 150 seconds.

8. The method of claim 1, further comprising, after annealing the substrate, cooling the substrate to a temperature suitable for cobalt deposition.

9. The method of claim 1, further comprising providing at least 2 substrates to the substrate support.

10. The method of claim 9, wherein a first set of substrates are at the first processing position and exposed to the cobalt containing precursor to deposit the cobalt layer atop the first set of substrates.

11. The method of claim 10, wherein a second set of substrates are at the second processing position.

12. The method of claim 11, wherein exposing the first set of substrates at the first processing position to the cobalt containing precursor and annealing the second set of substrates at the second processing position occurs simultaneously.

13. The method of claim 12, wherein the substrate support rotates the first set of substrates to the second processing position to anneal the first set of substrates to remove contaminants from the cobalt layer and rotates the second set of substrates to the first processing position to expose the second set of substrates to the cobalt containing precursor to deposit the cobalt layer atop the second set of substrates.

14. The method of claim 1, further comprising an even number of single substrates in an even number of separate processing positions, wherein half of the even number of separate processing positions are the first processing positions, and wherein another half of the even number of separate processing positions are the second processing positions.

15. The method of claim 1, further comprising flowing in an inert gas to the second processing position during (c).

16. The method of claim 1, further comprising, prior to exposing the substrate to a cobalt containing precursor, stopping the substrate support in the first processing position, and after rotating the substrate to a second processing position, stopping the substrate support in the second processing position.

17. The method of claim 2, further comprising, after annealing the substrate, cooling the substrate to a temperature suitable for cobalt deposition in at least at one of the first processing position, or the second processing position.

18. A method of depositing a cobalt layer atop a substrate, comprising:
   (a) depositing a cobalt layer atop a first set of one or more substrates by exposing the first set of one or more substrates to a cobalt containing precursor while in a first processing position of a rotatable substrate support disposed in a process chamber;

(b) rotating substrate support upon its central axis to move the first set of one or more substrates to a second processing position within the process chamber; and (c) annealing the first set of one or more substrates at the second processing position to remove contaminants from the cobalt layer, wherein the first set of one or more substrates are at the first processing position and exposed to the cobalt containing precursor to deposit the cobalt layer atop the first set of one or more substrates while simultaneously annealing a second set of one or more substrates at the second processing position within the process chamber, and wherein rotation of the substrate support simultaneously moves the first set of one or more substrates to the second processing position and the second set of one or more substrates to the first processing position, and wherein the annealing is at a second temperature greater than a first temperature at which the cobalt layer is deposited.

19. A method of depositing a cobalt layer atop a substrate, comprising:

(a) depositing a cobalt layer atop a first set of one or more substrates disposed on a substrate support by exposing the first set of one or more substrates to a cobalt containing precursor while in a first processing position within a process chamber;

(b) rotating the first set of one or more substrates into a second processing position within the process chamber while simultaneously rotating a second set of one or more substrates disposed on the substrate support into the first processing position;

(c) annealing the first set of one or more substrates at the second processing position to remove contaminants from the cobalt layer, wherein the annealing is at a second temperature greater than a first temperature at which the cobalt layer is deposited; and (d) simultaneous with (c), depositing a cobalt layer atop the second set of one or more substrates by exposing the second set of one or more substrates to a cobalt containing precursor while in the first processing position.

* * * * *